United States Patent
Babakhani et al.

(10) Patent No.: US 8,482,463 B2
(45) Date of Patent: Jul. 9, 2013

(54) ON-CHIP HIGHLY-EFFICIENT ANTENNAS USING STRONG RESONANT COUPLING

(75) Inventors: Aydin Babakhani, Pasadena, CA (US); Seyed Ali Hajimiri, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 494 days.

(21) Appl. No.: 12/454,815

(22) Filed: May 22, 2009

(65) Prior Publication Data

US 2009/0289869 A1 Nov. 26, 2009

Related U.S. Application Data

(60) Provisional application No. 61/128,553, filed on May 22, 2008.

(51) Int. Cl.
*H01Q 1/38* (2006.01)

(52) U.S. Cl.
USPC .................. 343/700 MS; 343/793; 343/767; 343/792.5

(58) Field of Classification Search
USPC .............. 340/572.7; 343/700 MS, 767, 793
See application file for complete search history.

(56) References Cited

U.S. PATENT DOCUMENTS

| | | | |
|---|---|---|---|
| 7,102,520 B2 * | 9/2006 | Liu et al. .................... | 340/572.1 |
| 2002/0162894 A1 | 11/2002 | Kuramochi | |
| 2004/0104847 A1 * | 6/2004 | Killen et al. ........... | 343/700 MS |
| 2008/0291115 A1 | 11/2008 | Doan et al. | |

FOREIGN PATENT DOCUMENTS

| | | |
|---|---|---|
| EP | 0977145 A2 | 2/2000 |
| EP | 977145 A2 * | 2/2000 |
| EP | 1031939 A1 | 8/2000 |
| JP | 10-069533 | 3/1998 |
| JP | 10069533 A * | 3/1998 |

OTHER PUBLICATIONS

A. Babakhani, X. Guan, A. Komijani, A. Natarajan, and A. Hajirniri, "A 77 GHz phased array transceiver with on chip dipole antennas. Receiver and on-chip antennas," IEEE Journal of Solid-State Circuits: vol. 41, No. 12, pp. 2795-2806, Dec. 2006.
A. Babakhani, D. B. Rutledge, and A. Hajimiri, "A Near-Field Modulation Technique Using Antenna Reflector Switching," in IEEE ISSCC Digest of Technical Papers, Feb. 2008, pp. 188-189.

(Continued)

*Primary Examiner* — Dieu H Duong
(74) *Attorney, Agent, or Firm* — Milstein Zhang & Wu LLC; Joseph B. Milstein

(57) ABSTRACT

The invention relates to an antenna structure for coupling electromagnetic energy between a chip and an off-chip element, including a first resonant structure disposed on or in a chip. The first resonant structure is configured to have a first resonant frequency. The antenna structure also includes a second resonant structure disposed on or in an off-chip element. The second resonant structure is configured to have a second resonant frequency substantially the same as the first resonant frequency. The first resonant structure and the second resonant structure are mutually disposed within a near field distance of each other to form a coupled antenna structure that is configured to couple electromagnetic energy between the chip and the off-chip element. The electromagnetic energy has a selected wavelength in a wavelength range from microwave to sub-millimeter wave. The invention also relates to a method of calculating dimensions for a highly coupled antenna structure.

20 Claims, 19 Drawing Sheets

OTHER PUBLICATIONS

D. B. Rutledge et al., "Integrated-circuit antennas," in Infrared and Millimeter-Waves. New York: Academic, 1983, pp. 1-23.

N. Engheta and C. H. Papas, Radio Science, vol. 17, pp. 1557-1566, 1982.

H. Kogelnik, "Theory of dielectric waveguides," in Integrated Optics, T. Tamir, Ed. New York: Springer-Verlag, pp. 13-25, 1979.

Written Opinion of the International Searching Authority for PCT/US2009/003169 dated Dec. 29, 2009.

International Search Report for PCT/US2009/003169 dated Dec. 29, 2009.

* cited by examiner

PRIOR ART

ON-CHIP HIGHLY-EFFICIENT ANTENNAS USING STRONG RESONANT COUPLING

CROSS-REFERENCE TO RELATED APPLICATIONS

This application claims priority to and the benefit of U.S. provisional patent application Ser. No. 61/128,553, ON-CHIP HIGHLY-EFFICIENT ANTENNAS USING STRONG RESONANT COUPLING, filed May 22, 2008, which application is incorporated herein by reference in its entirety.

STATEMENT REGARDING FEDERALLY FUNDED RESEARCH OR DEVELOPMENT

The U.S. Government has certain rights in this invention pursuant to Grant No. ECE0239343 awarded by National Science Foundation.

FIELD OF THE INVENTION

The invention relates to coupling electromagnetic signals from an integrated circuit chip in general and particularly to coupling microwave, millimeter wave, and sub-millimeter wave electromagnetic signals from a chip to an off-chip antenna.

BACKGROUND OF THE INVENTION

Radio and RADAR circuits and systems operating at high frequencies (e.g. microwave frequencies), are increasingly being implemented as integrated structures. Such systems typically include a scheme to couple microwave electromagnetic energy to and/or from the integrated structure. For example, off-chip antennas have been used with wirebond or flip-chip technologies. FIG. 1 shows the use of wire-bond technology to couple electromagnetic energy from chip 111 to an off-chip antenna 102 disposed on a printed circuit board (PCB) 101 via a transmission line 110. Such wire-bond technologies have been extensively used to build relatively low-frequency connections (below 5 GHz). The typical diameter of the gold wires used in such wire-bond technology is about 25 μm. These stand-alone wires provide a parasitic inductance of about 1 nH/mm which introduces a large mismatch in mm-wave frequencies. To resonate out the inductance of these wires and carry a high frequency signal, a ground wire should be placed adjacent to the signal wire with the right distance to maintain a good impedance match (usually 50Ω) to the antenna. Placing such a wire requires an accurate control of the wirebond profile (to an accuracy of about 1 μm) which significantly increases the packaging cost in high-volume production.

In applications requiring a smaller parasitic inductance, flip-chip technology is typically utilized. In flip-chip technology, as shown in FIG. 2, the silicon die is flipped on top of a PCB (e.g. flip chip 210) and gold or solder bumps 211 are used to connect the on-chip pads to PCB traces leading to the PCB transmission line 110. Today's flip-chip technology provides gold bumps as small as 50-100 μm in diameter and height and introduces a relatively small parasitic inductance compared to wire-bond technology. However, the shape of the bump is not predictable enough (accuracy of 1 μm) to be used in relatively high frequency applications (higher than 50 GHz).

One of the important disadvantages of conventional silicon-based on-chip antennas is the low antenna efficiency. The low antenna efficiency is a result of two factors; silicon's high dielectric constant (11.7), and the substrate's low resistivity (1-10 Ω·cm). The high level of doping required to fabricate active circuits limits the silicon substrate's resistivity. Also, as previously reported by the present inventors in Babakhani, et al., A 77 GHz phased array transceiver with on chip dipole antennas: Receiver and on-chip antennas, IEEE Journal of Solid-State Circuits, vol. 41, no.12, pgs. 2795-2806, December 2006, and Babakhani, et al., A Near-Field Modulation Technique Using Antenna Reflector Switching," in IEEE Antennas and Propagation International Symposium, June 2007, pgs. 4369-4372, and shown in the illustration of FIG. 3, both the high dielectric constant of silicon and a relatively large substrate thickness (200-300 μm) cause most of the on-chip antenna output power to be coupled into substrate-modes in unshielded structures.

Use of an on-chip ground shield to isolate the on-chip antenna from the lossy substrate causes the radiation efficiency to be very small (around 1%). In standard silicon processes the distance between on-chip metal layers rarely exceeds 15 μm. A ground layer at this distance, which is much smaller than the wave-length in mm-wave frequencies (e.g. 2.5 mm wavelength in $SiO_2$ at 60 GHz), shorts the antenna by introducing a negative image current very close to the antenna and hence reduces both the radiation resistance and the efficiency. On the other hand, if an on-chip ground shield is not used, the silicon substrate behaves as a dielectric waveguide, generates the substrate modes, and leads the power to the chip edges resulting in an undesirable pattern. Thus, due to the silicon substrate's low resistivity most of the power that couples into substrate-modes disappears as heat reducing the overall antenna efficiency.

Among the conventional ways to alleviate the substrate coupling problem, a silicon lens can be also used at the backside of the chip such as has been described by Babakhani, et al, in A 77 GHz phased array transceiver with on chip dipole antennas: Receiver and on-chip antennas, IEEE Journal of Solid-State Circuits, v.41, no. 1 2, pgs. 2795-2806, December 2006, Babakhani, et al, in A Near-Field Modulation Technique Using Antenna Reflector Switching, in IEEE Antennas and Propagation International Symposium, June 2007, pgs. 4369-4372, and Rutledge, et al., in Integrated-circuit antennas, Infrared and Millimeter-Waves. New York: Academic, 1983, pgs. 1-90. By attaching an un-doped silicon hemispherical lens (or a dielectric lens with a dielectric constant similar to that of silicon) to the backside of the substrate as shown in FIG. 4, antenna efficiencies of about 10% can be achieved. Due to the impedance mismatch between the silicon and the air, about 30% of the radiated power is reflected from the silicon-air boundary $$\left(Z_{si} = \sqrt{\frac{\mu_0}{\varepsilon_{si}}} = 110\Omega \text{ versus } Z_{air} = \sqrt{\frac{\mu_0}{\varepsilon_0}} = 377\Omega\right).$$

Because the wave travels inside the silicon lens beforereaching to the air, it gets attenuated due to the non-idealities and doping of the silicon lens. While use of a silicon lens substantially increases the complexity of the package and its manufacturing cost, it still remains as one of the effective methods in implementing on-chip antennas.

What is needed, therefore, is a more efficient and cost effective way to couple relatively high frequency signals to an off-chip antenna.

SUMMARY OF THE INVENTION

In one aspect, the invention relates to an antenna structure for coupling electromagnetic energy between a chip and an off-chip element, including a first resonant structure disposed on or in a chip. The first resonant structure is configured to have a first resonant frequency. The antenna structure also includes a second resonant structure disposed on or in an off-chip element. The second resonant structure is configured to have a second resonant frequency substantially the same as the first resonant frequency. The first resonant structure and the second resonant structure are mutually disposed within a near field distance of each other to form a coupled antenna structure that is configured to couple electromagnetic energy between the chip and the off-chip element. The electromagnetic energy has a selected wavelength in a wavelength range from microwave to sub-millimeter wave.

In one embodiment, the off-chip element is selected from the group consisting of a circuit board, a thin film structure, a redistribution layer (RDL), a micro electro mechanical system (MEMS) based structure, a nano electro mechanical system (NEMS) based structure, and a different chip.

In another embodiment, the coupled antenna structure further includes a low loss dielectric disposed between the chip and the off-chip element.

In yet another embodiment, the low loss dielectric comprises air.

In yet another embodiment, the coupled antenna structure further includes a vacuum disposed between the chip and the off-chip element.

In yet another embodiment, at least a selected one of the first resonant structure and the second resonant structure includes a resonant loop and a resonant capacitance.

In yet another embodiment, at least a selected one of the first resonant structure and the second resonant structure includes a dipole antenna.

In yet another embodiment, at least a selected one of the first resonant structure and the second resonant structure includes a slot antenna.

In yet another embodiment, at least a selected one of the first resonant structure and the second resonant structure includes a yagi antenna.

In yet another embodiment, at least a selected one of said first resonant structure and said second resonant structure comprises a planar antenna.

In yet another embodiment, the planar antenna comprises an antenna selected from the group consisting of a loop antenna, patch antenna, and log-periodic antenna.

In yet another embodiment, the planar antenna comprises a structure selected from the group consisting of a MEMS structure, a NEMS structure, a meta material and a periodic structure.

In yet another embodiment, the chip comprises a flip chip attached to the off-chip element by a selected one of solder bumps and gold bumps.

In yet another embodiment, an efficiency of coupling is substantially independent of a tilt of the chip relative to the off-chip element caused by different heights of the bumps.

In yet another embodiment, an efficiency of coupling is substantially independent of a lateral translation attachment alignment of the flip chip.

In another aspect, the invention relates to a method of calculating dimensions for a highly coupled antenna structure comprising the steps of: providing a desired resonant frequency for the highly coupled antenna structure; providing a type of resonant antenna structure for each of two antennas of the highly coupled antenna structure; providing an equation that calculates the quantity $$\frac{Q_{load}}{Q_{total}}$$

for the highly coupled antenna structure; selecting values of RL and physical dimensions of the highly coupled antenna structure; calculating the quantity $$\frac{Q_{load}}{Q_{total}};$$

and iteratively repeating the steps of selecting and calculating to maximize the quantity.

In one embodiment, the step of providing an equation comprises providing the equation:

$$\frac{1}{Q_{total}} = \frac{1}{Q_{ohmic}} + \frac{1}{Q_{rad}} + \frac{1}{Q_{substrate\_loss}} + \frac{1}{Q_{load}}.$$

The foregoing and other objects, aspects, features, and advantages of the invention will become more apparent from the following description and from the claims.

BRIEF DESCRIPTION OF THE DRAWINGS

For a further understanding of these and objects of the invention, reference will be made to the following Detailed Description, which is to be read in connection with the accompanying drawings, where.

The drawings are not necessarily to scale, emphasis instead generally being placed upon illustrating the principles of the invention. In the drawings, like numerals are used to indicate like parts throughout the various views.

DETAILED DESCRIPTION

In this disclosure, a new technique is introduced which solves the cost/efficiency problems of conventional methods to couple microwave, millimeter wave, and sub-millimeter wave electromagnetic signals from a chip to an off-chip device, typically an off-chip antenna. In one exemplary embodiment, a near-field resonant coupled antenna structure is used to "suck" out the power from an on-chip component and couple it to a PCB based off-chip antenna. Due to the strong resonance characteristics, only a small part of the power gets coupled to the substrate modes resulting in a highly efficient signal radiation system. Also due to the unique characteristics of the strong coupling, a small change in the dimensions of the package (for example the distance between the PCB and the on-chip structures) does not result in a significant impedance mismatch between the off-chip antenna and the on-chip structures. These two very important characteristics, high-efficiency and robustness, reduce the overall mm-wave packaging cost and system power consumption and hence revolutionize the field of mm-wave IC packaging.

Figure 1:
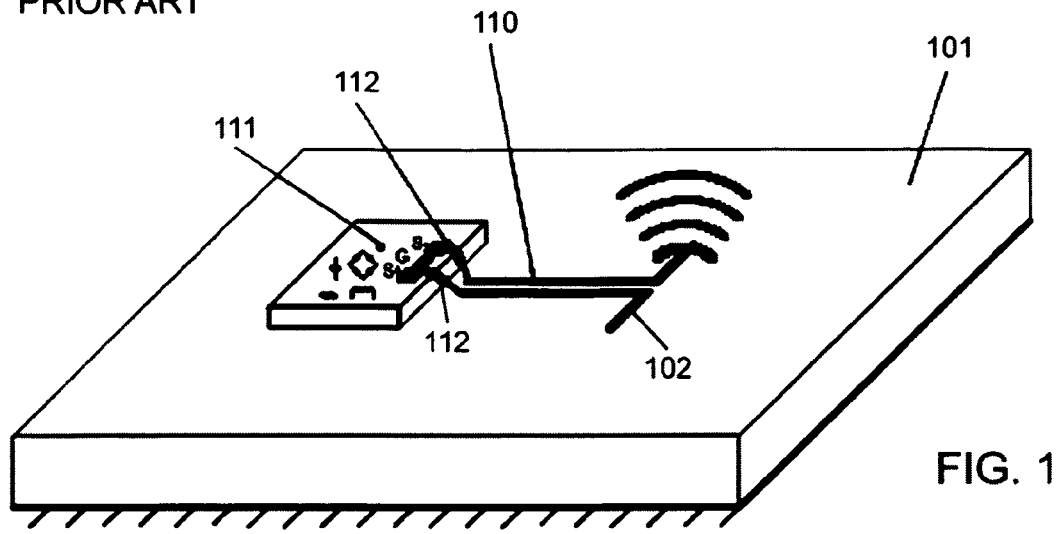
FIG. 1 shows an illustration of a wirebond connection to an off-chip antenna.
Figure 2:
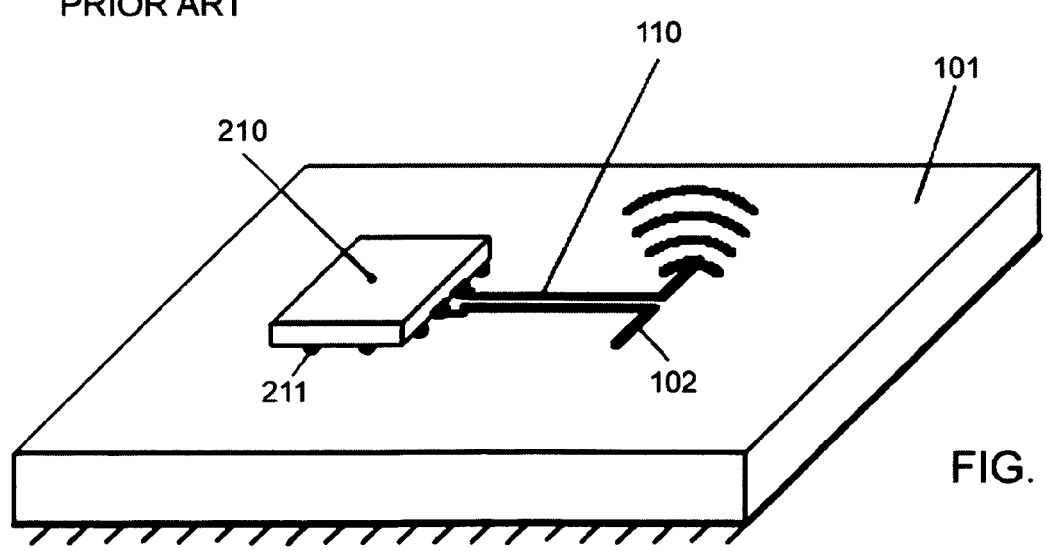
FIG. 2 shows an illustration of an off-chip antenna using flipped-chip technology.
Figure 3:
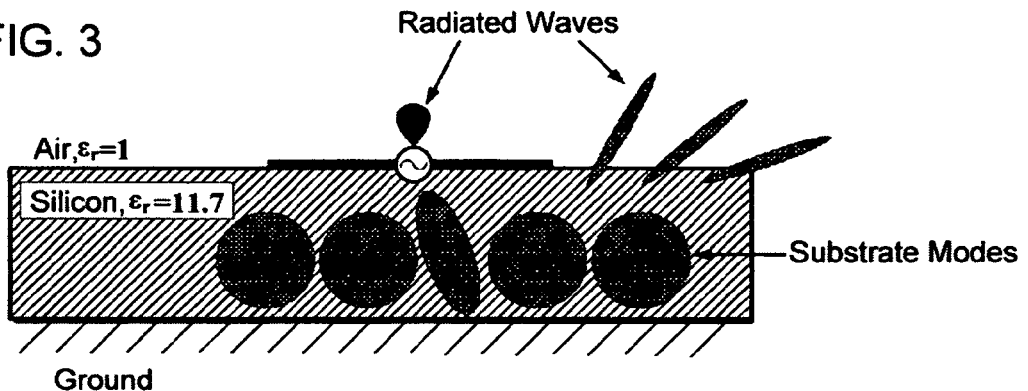
FIG. 3 shows an illustration of substrate modes.
Figure 4:
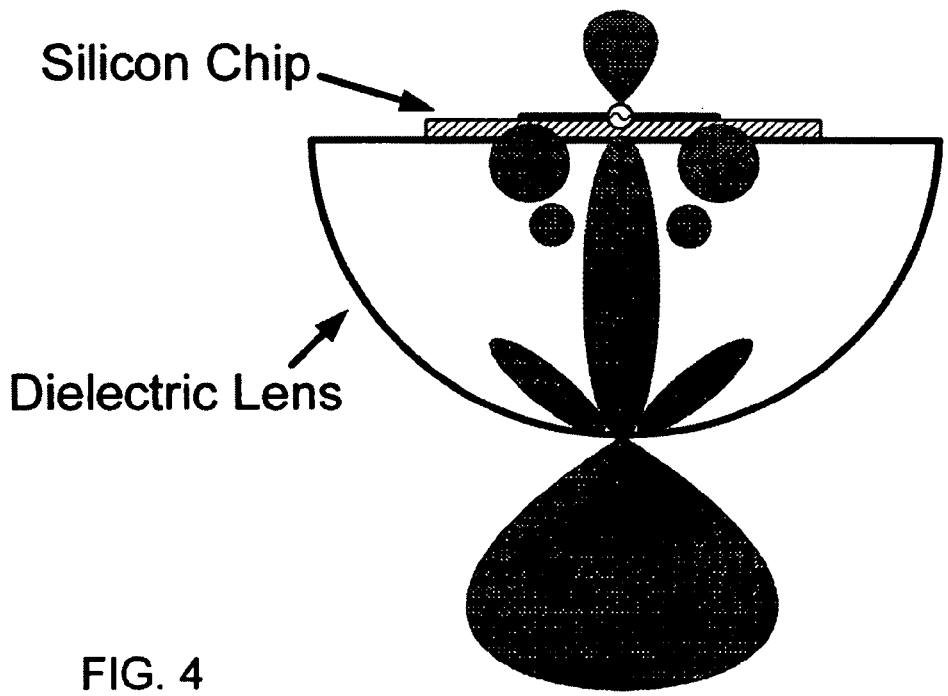
FIG. 4 shows an illustration of a silicon lens.
Figure 5:
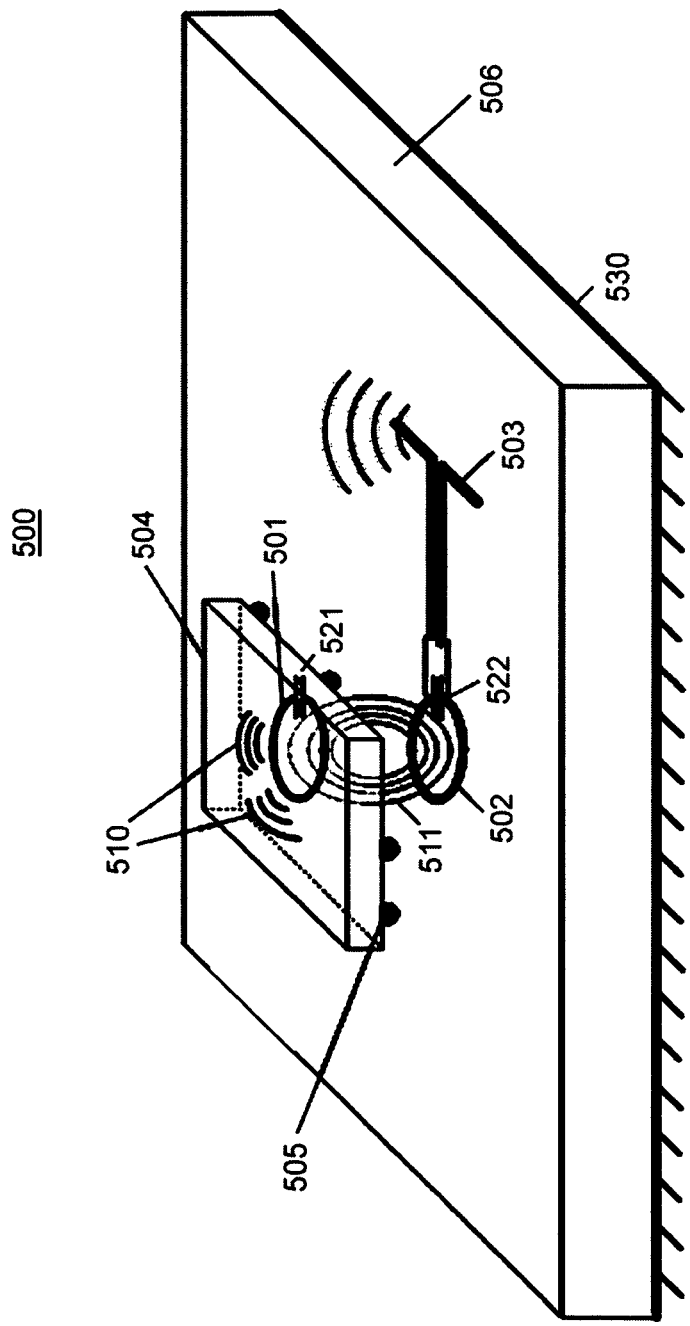
FIG. 5 shows an illustration of one exemplary embodiment of strong coupling between an on-chip resonant loop and a printed circuit board (PCB) resonant loop.

FIG. 5 illustrates one exemplary embodiment of strong coupling between an on-chip resonant loop 501 and a printed circuit board (PCB) resonant loop 502. The illustration of FIG. 5 shows a near-field resonant coupled antenna structure 500 used to send or transmit the power from an on-chip component of a flip chip 504, and to couple it to a PCB based off-chip antenna 503 disposed on PCB 506 having an optional ground plane 530. In effect, the PCB based off-chip antenna 503 disposed on PCB 506 "sucks" the power from the on-chip resonant loop 501. In this exemplary embodiment, two similar resonant loops 501 and 502, each including an inductor (the loop) with a capacitor (521 and 522 respectively), are placed at the near-field of each other as illustrated by the strong resonant near field coupling 511. Due to the strong resonance between these two loops 501 and 502, most of the on-chip power is coupled to the off-chip PCB antenna 503 through the loops 501 and 502. In this case a small part of the on-chip power is converted to the substrate modes. To maintain a stable mechanical structure, solder or gold bumps 505 can be used to hold the flipped chip 504 on the PCB 506. These bumps 505 can also be used to carry low-frequency and/or DC signals (e.g. DC power) to flip chip 504. One of the unique characteristics of the strong coupling is its stability against the geometry variations and parasitic surroundings around the structure. This robustness property alleviates the accuracy requirements of the dimensions of the package (e.g. the package of flip chip 504). Consequently, a small variation in the relative location/angle of the silicon die (not shown) within the package, as well as a small variation in how the package is attached to the PCB, has only a minimal effect in the efficiency of the power transfer.

While in the example above two loops are used, any suitable resonant structures disposed within the near field of each other can be used. Suitable exemplary resonant structures include a dipole antenna, a yagi antenna, a slot antenna, loop antenna, patch antenna, log-periodic antenna, and antennas based on MEMS/NEMS, meta materials and periodic structures). Any suitable planar antenna such as a planar loop antenna, planar patch antenna, and planar log-periodic antenna can also be used as one or both of the resonant structures. Suitable technologies for such planar antennas include MEMS, NEMS, meta materials and periodic structures.

Typically such resonant structures are in the near field of each other if they are placed within an approximate distance of about $\frac{1}{10}\lambda$ of each other where $\lambda$ is the wavelength of the resonant frequency ($\lambda = c/f$, where c is the speed of light and f is the resonant frequency). Also, note that while a flip chip is used in the example discussed above, any suitable chip package can be used. Any chip package that allows the resonant radiating antenna structure in the chip to be disposed within the near field of the resonant structure on or in an off-chip element (such as circuit board, thin film, RDL (redistribution layer), MEMS (micro electro mechanical system), NEMS (nano electro mechanical system) based structure, or a different chip) that provides strong coupling is suitable for such use.

Note that a first resonant structure can be disposed on or in the chip. For example, the resonant structure can be formed within an integrated structure of the chip, on a surface of the integrated structure, or even on a surface of a package housing the integrated structure. Similarly, a second resonant structure can be disposed on or in the off-chip element. For example, where the off-chip element is a circuit board, such as in the exemplary embodiment of FIG. 5, the second resonant structure can be disposed on an outer surface of the circuit board or on any suitable layer within the circuit board.

A highly coupled antenna structure is defined herein as having two resonant structures within the near field of each other resulting in strong coupling between the two resonant structures. In a highly coupled antenna structure there are one, two, or more radiation modes in the near field. For example, in a highly coupled antenna structure there is a traveling wave in addition to any inductive coupling. Thus a highly coupled antenna structure distinguishes over a simple pair of non-resonant loops that are inductively coupled, as an example.

There is also typically a low loss dielectric disposed between the chip and the circuit board. The low loss dielectric can be air, such as, for example, the air between a surface of a flip chip and a surface of the circuit board in a space defined in part by the height of the solder bumps. In other embodiments, there can be a vacuum, gas, or gas composition, disposed between the chip and the circuit board.

A highly coupled antenna structure can be used to transmit electromagnetic energy (microwave, millimeter wave, or sub-millimeter wave electromagnetic signals) from the chip to the circuit board (e.g. to couple to an antenna such as PCB dipole 503 for further radiation out from the circuit board), to receive electromagnetic energy into the chip from the circuit board, or for transmitting and receiving electromagnetic energy (two-way or bi-directional operation).

Figure 6:
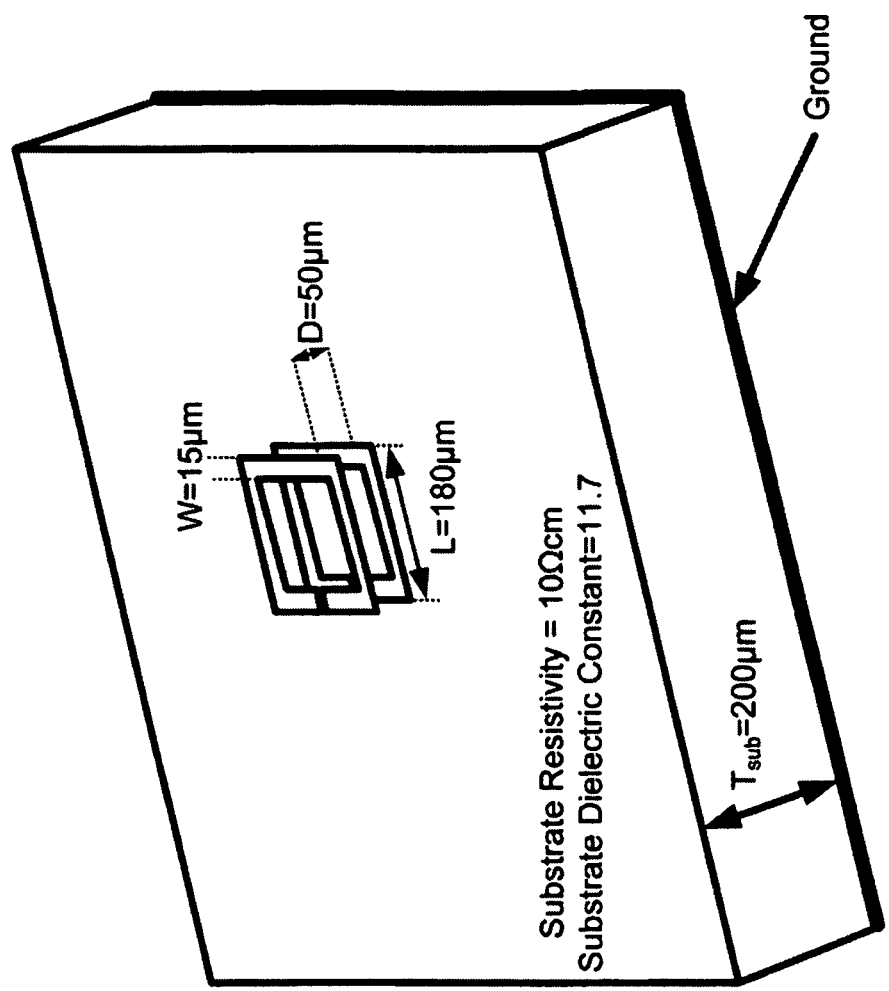
FIG. 6 shows an illustration of one exemplary 3D simulation prototype structure.

Turning now to simulations of highly coupled antenna structures, moment-based software package, IE3D (available from Zeland Software, Inc. of Fremont, Calif.), was used to simulate real electromagnetic structures and to prove the abovementioned unique characteristics of the system. FIG. 6 shows a 3D structure of a prototype embodiment simulated using IE3D. In the prototype of FIG. 6, two loops were placed at a distance of D from each other. The loops had a width, W, and length, L. A substrate dielectric constant of 11.7 (Silicon) and a substrate resistivity of 10 Ωcm was used in the simulations. The simulation was performed for a substrate thickness of 200 μm. Loop 601 simulated an on-chip loop and loop 602 simulated an off-chip loop such as can be fabricated on a PCB. In the IE3D simulations, a metal thickness of 6 μm with sheet resistance of 5 mΩ/□ was used.

Figure 7:
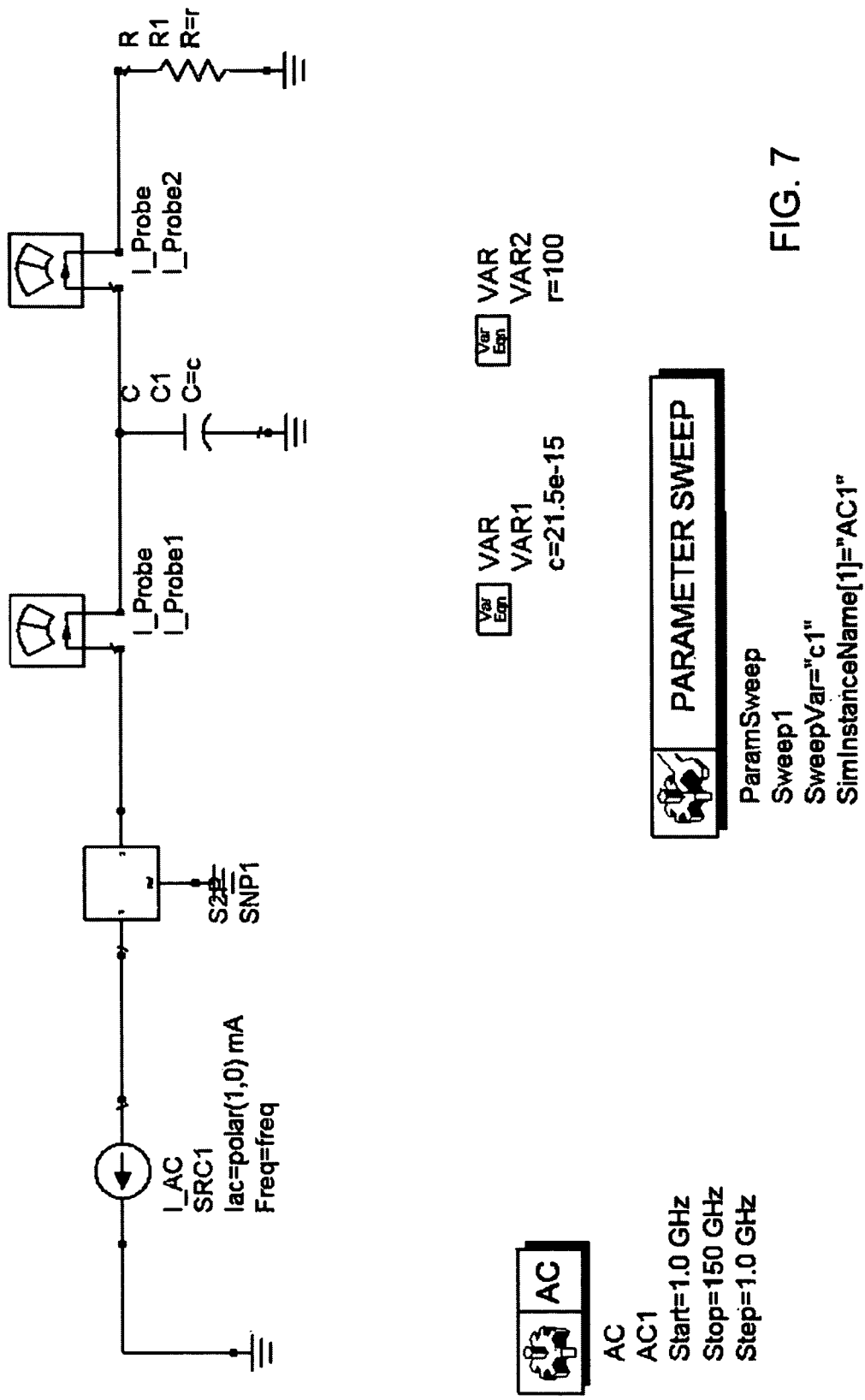
FIG. 7 shows a schematic diagram of a simulated circuit.
Figure 8:
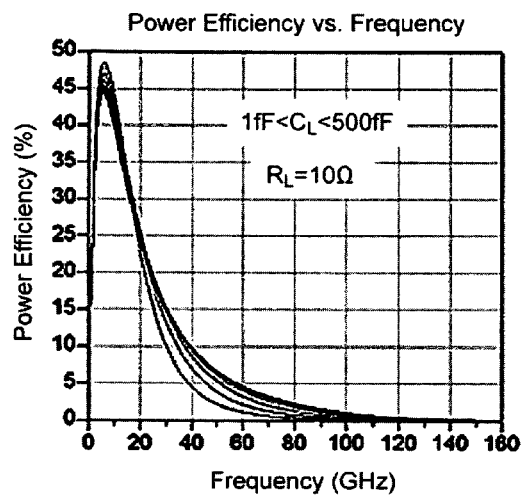
FIG. 8 shows a graph of power efficiency versus frequency for selected exemplary values of $C_L$ and an $R_L$ of $10\Omega$.
Figure 9:
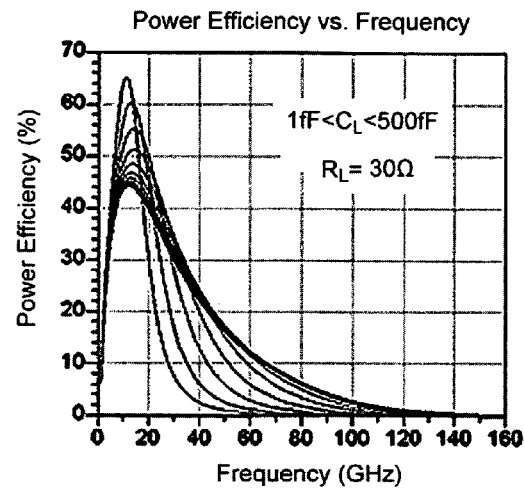
FIG. 9 shows a graph of power efficiency versus frequency for selected exemplary values of $C_L$ and an $R_L$ of $30\Omega$.
Figure 10:
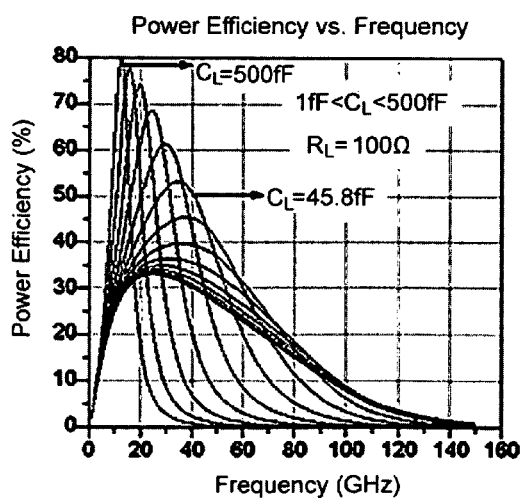
FIG. 10 shows a graph of power efficiency versus frequency for selected exemplary values of $C_L$ and an $R_L$ of $100\Omega$.
Figure 11:
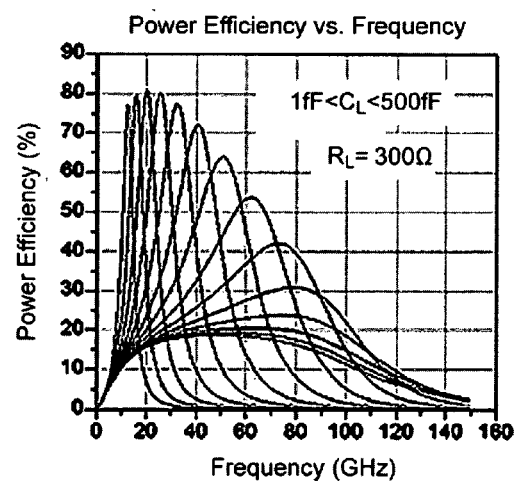
FIG. 11 shows a graph of power efficiency versus frequency for selected exemplary values of $C_L$ and an $R_L$ of $300\Omega$.
Figure 12:
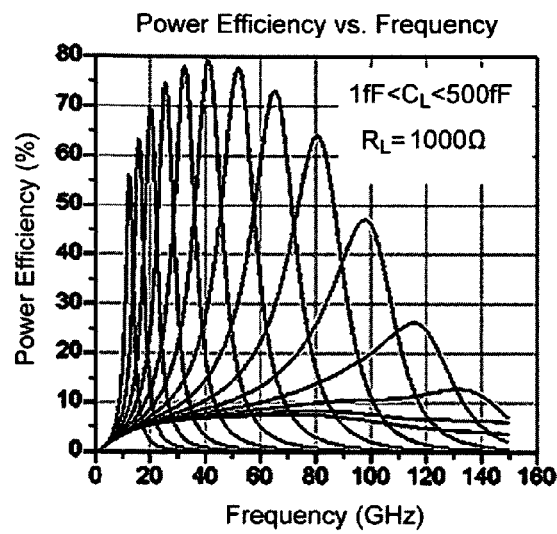
FIG. 12 shows a graph of power efficiency versus frequency for selected exemplary values of $C_L$ and an $R_L$ of $1000\Omega$.
Figure 13:
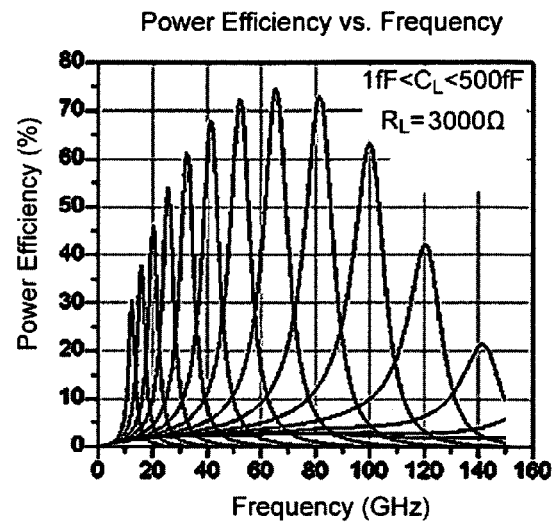
FIG. 13 shows a graph of power efficiency versus frequency for selected exemplary values of $C_L$ and an $R_L$ of $3000\Omega$.
Figure 14:
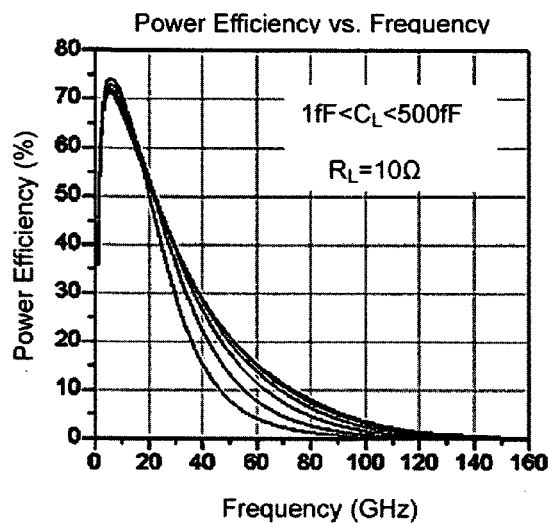
FIG. 14 shows a graph of power efficiency versus frequency for selected exemplary values of $C_L$ and an $R_L$ of $10\Omega$ with no on-chip ground-shield and L=180 µm.
Figure 15:
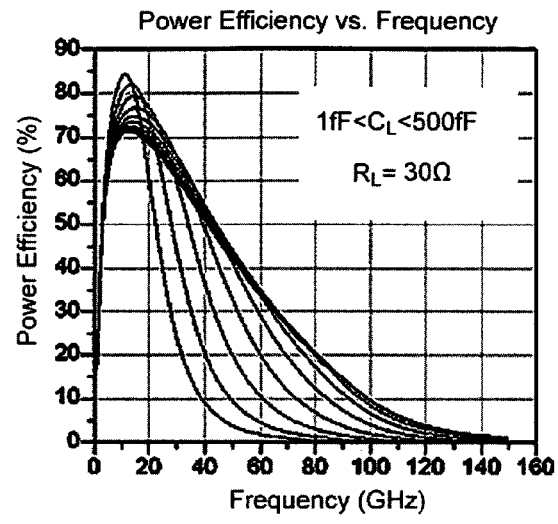
FIG. 15 shows a graph of power efficiency versus frequency for selected exemplary values of $C_L$ and an $R_L$ of 30Ω with no on-chip ground-shield and L=180 μm.
Figure 16:
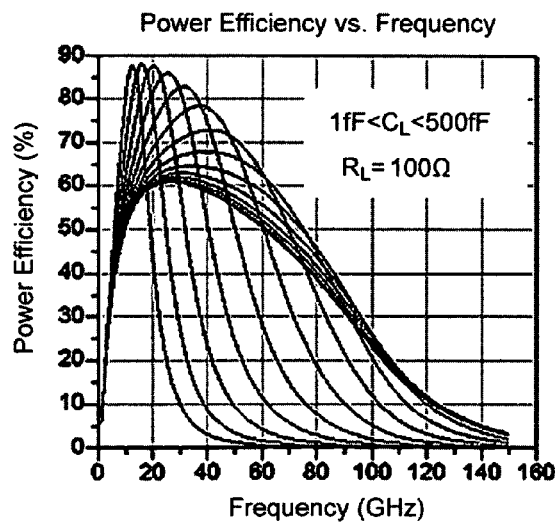
FIG. 16 shows a graph of power efficiency versus frequency for selected exemplary values of $C_L$ and an $R_L$ of 100Ω with no on-chip ground-shield and L=180 μm.
Figure 17:
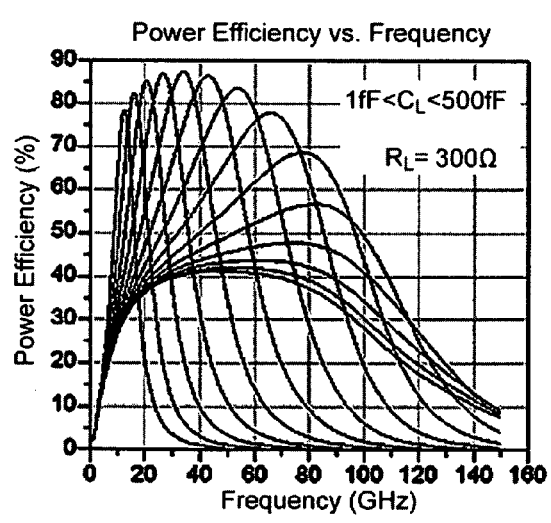
FIG. 17 shows a graph of power efficiency versus frequency for selected exemplary values of $C_L$ and an $R_L$ of 300Ω with no on-chip ground-shield and L=180 μm.
Figure 18:
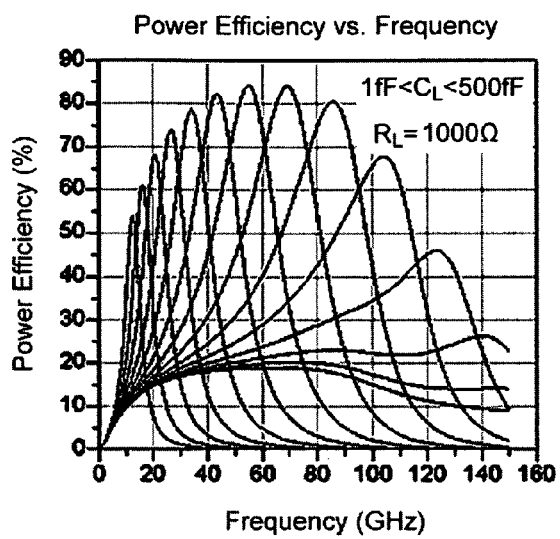
FIG. 18 shows a graph of power efficiency versus frequency for selected exemplary values of $C_L$ and an $R_L$ of 1000Ω with no on-chip ground-shield and L=180 μm.
Figure 19:
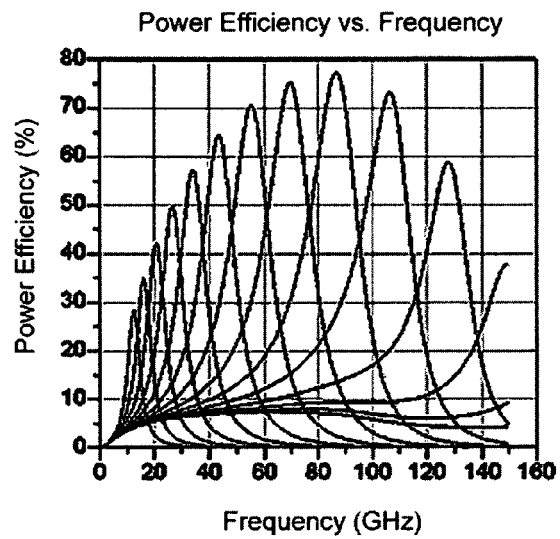
FIG. 19 shows a graph of power efficiency versus frequency for selected exemplary values of $C_L$ and an $R_L$ of 3000Ω with no on-chip ground-shield and L=180 μm.
Figure 20:
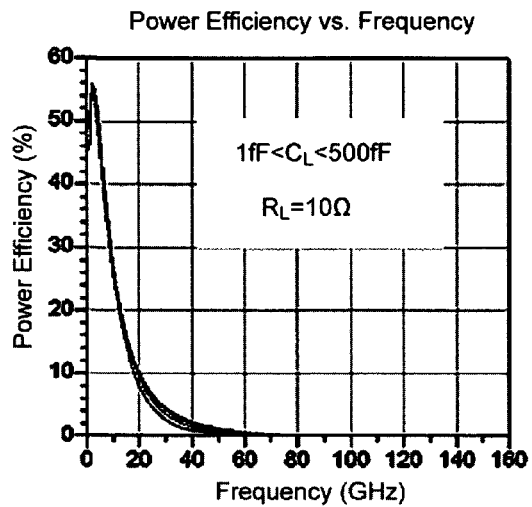
FIG. 20 shows a graph of power efficiency versus frequency for selected exemplary values of $C_L$ and an $R_L$ of 10Ω with no on-chip ground-shield and L=330 μm.
Figure 21:
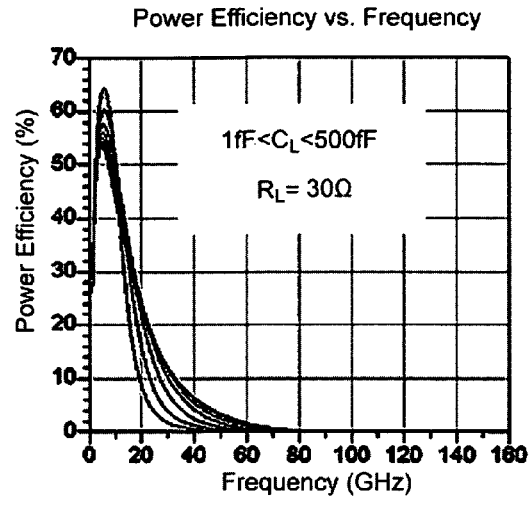
FIG. 21 shows a graph of power efficiency versus frequency for selected exemplary values of $C_L$ and an $R_L$ of 30Ω with no on-chip ground-shield and L=330 μm.
Figure 22:
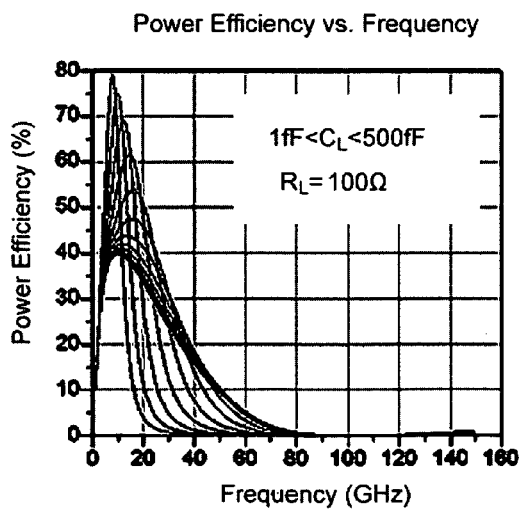
FIG. 22 shows a graph of power efficiency versus frequency for selected exemplary values of $C_L$ and an $R_L$ of 100Ω with no on-chip ground-shield and L=330 μm.
Figure 23:
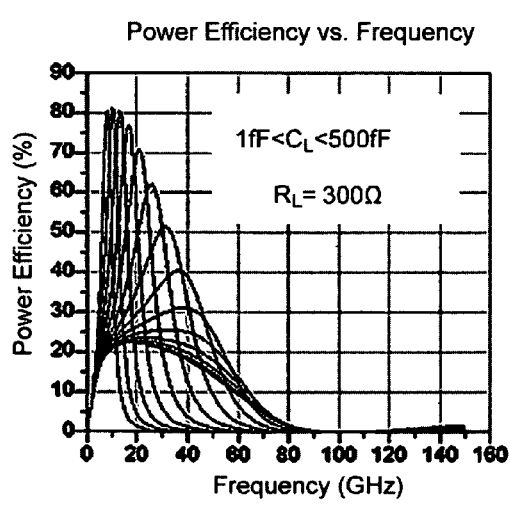
FIG. 23 shows a graph of power efficiency versus frequency for selected exemplary values of $C_L$ and an $R_L$ of 300Ω with no on-chip ground-shield and L=330 μm.
Figure 24:
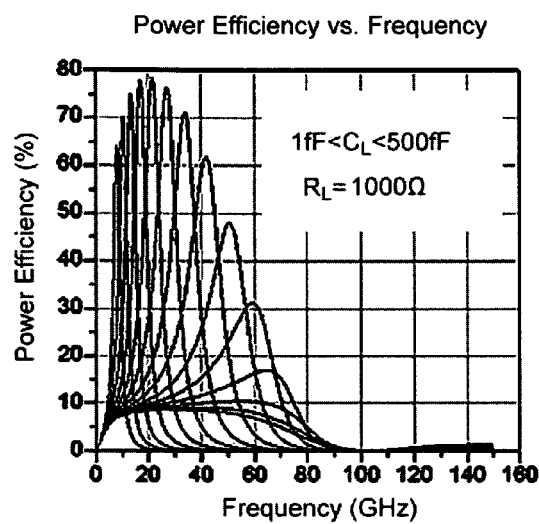
FIG. 24 shows a graph of power efficiency versus frequency for selected exemplary values of $C_L$ and an $R_L$ of 1000Ω with no on-chip ground-shield and L=330 μm.
Figure 25:
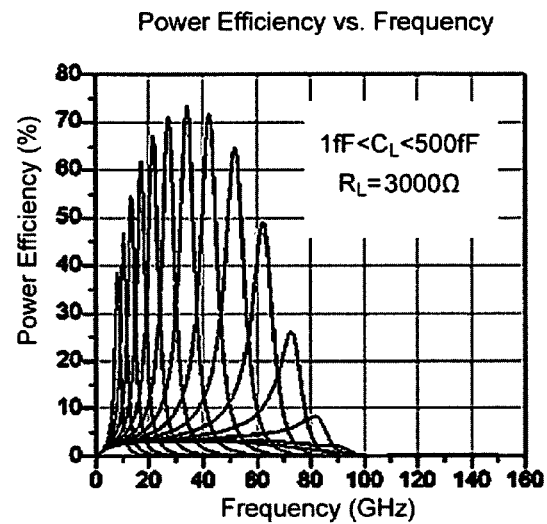
FIG. 25 shows a graph of power efficiency versus frequency for selected exemplary values of $C_L$ and an $R_L$ of 300Ω with no on-chip ground-shield and L=330 μm.

To further simulate the structure, each loop was cut and a localized differential port was placed at each cut location. A 2×2 s-parameter matrix was extracted from the IE3D simulations and used in the advanced design system (ADS) (available from Agilent Technologies, Inc. of Santa Clara Calif.). FIG. 7 shows a schematic that was used in the ADS simulations. As shown in FIG. 7, an on-chip input current was connected to the input port (vin) of the s-parameter box and a load capacitor, $C_L$, with size of c and a resistive load, $R_L$, with size of r was connected to the second port of the s-parameter box. One goal was to find optimum values for the dimensions of the loops, their distance from each other, load capacitance, and load resistance to maximize the delivered power to the load.

Turning now to power efficiency, the power efficiency of the system can be defined by Eqn. (1):

$$\text{Efficiency} = \frac{P_{load}}{P_{in}} \qquad \text{Eqn. (1)}$$

where $P_{load}$ is the power delivered to the load ($R_L$) connected to the PCB loop and $P_{in}$ is the input power going into the on-chip loop. In typical applications, the power delivered to $R_L$ can further be coupled to an efficient PCB antenna.

At each power transmission cycle between the loops, some part of the power is radiated, some part is wasted due to the resistance of the loop, some part gets absorbed in the substrate modes (particularly if there is no on-chip shielding ground layer), and some part power is delivered to the load, $R_L$. Note that one goal of a highly coupled antenna structure is to maximize the delivered power to the $R_L$, and then transfer it to an efficient off-chip antenna while minimizing the wasted power due to substrate modes, and metallic resistance of the loop.

Turning now to a discussion of four design tradeoffs, first, if a very large $R_L$ is chosen, most of the power will be wasted due to the finite loop metal resistivity (and low silicon substrate resistivity if there is no on-chip ground shield). On the other hand, if a very small $R_L$, is chosen, the effective Q of the structure will go down and the coupling between two loops will be degraded resulting in low power efficiency. Consequently, for each frequency there is an optimum value for $R_L$ to maximize the power efficiency.

Second, if we use large loops, then at each power transmission cycle between two loops, a significant part of the power will be radiated reducing the overall Q of the system. Thus use of relatively large loops deteriorates the power efficiency of the system. On the other hand, for very small loops, the coupling between two loops will be very small and the amount of the power moved from one loop to the other one at each cycle will be very small, resulting in low power efficiency. Thus, for each frequency it is expected that there is an optimum value for the size of the loop to maximize the power efficiency of the system.

Third, the effective Q (quality factor) of the system can be calculated by Eqn. (2):

$$\frac{1}{Q_{total}} = \frac{1}{Q_{ohmic}} + \frac{1}{Q_{rad}} + \frac{1}{Q_{substrate\_loss}} + \frac{1}{Q_{load}} \qquad \text{Eqn. (2)}$$

The objective is to maximize $$\frac{Q_{load}}{Q_{total}}.$$

The bandwidth of the system can be calculated as Eqn. (3), where $\omega_0$ is the resonant frequency, $$\Delta\omega = \frac{\omega_0}{Q_{total}} \qquad \text{Eqn. (3)}$$

From Eqn. (3), it can be seen that there is a tradeoff between the efficiency bandwidth of the system and the total quality factor.

Fourth, simulation results have also shown there to be a tradeoff between the robustness of the system and the strength of the resonance. However, efficiency of a system consisting of two strongly coupled resonant loops does not vary much with the variations in the dimensions of the structure and the shape and location of the surroundings.

EXAMPLES (SIMULATIONS)

Figure 26:
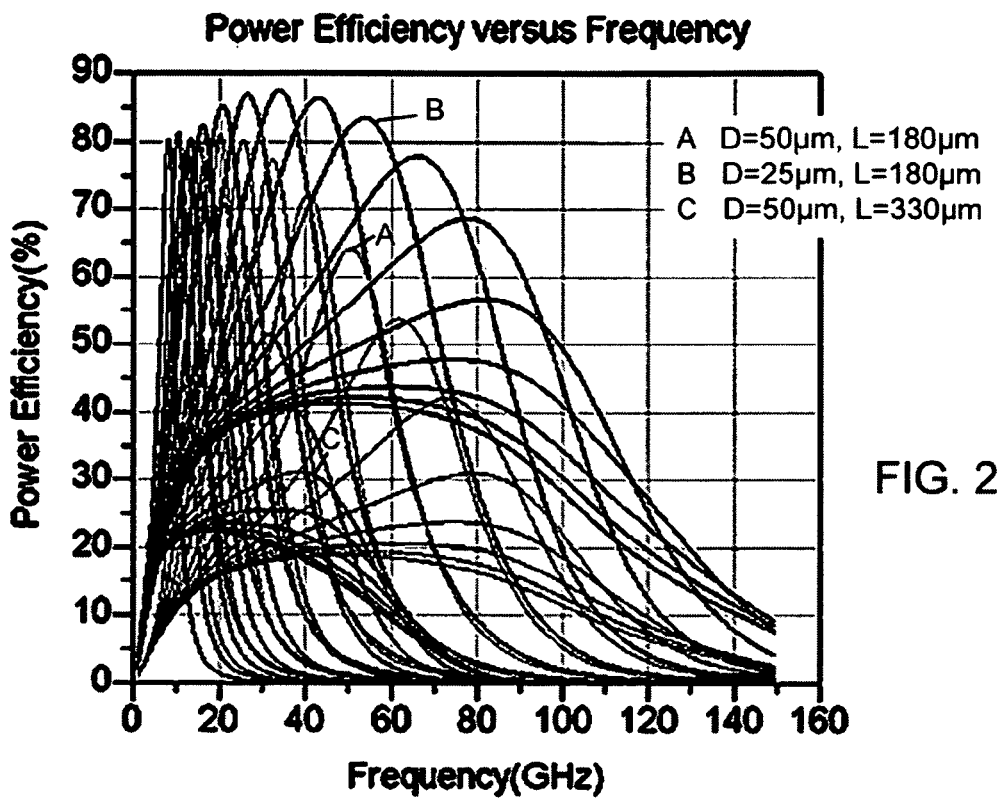
FIG. 26 shows a graph of power efficiency versus frequency for selected exemplary values of $C_L$ and an $R_L$ of 300Ω for three different sets of D and L.
Figure 27:
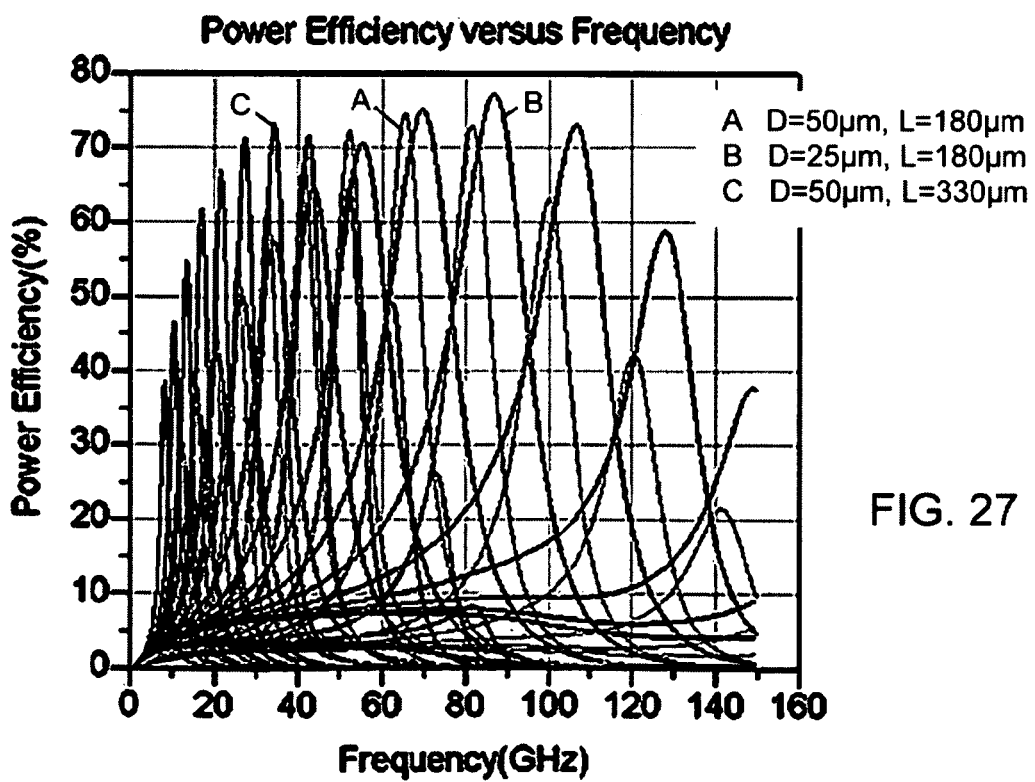
FIG. 27 shows a graph of power efficiency versus frequency for selected exemplary values of $C_L$ and an $R_L$ of 3000Ω for three different sets of D and L.

The graphs of FIG. 8 to FIG. 13 show efficiency plotted against frequency for different values of $R_L$ and selected values of $C_L$. Each of the curves on these graphs corresponds respectively to a selected test value of $C_L$ over a characteristic range of 1 femtoFarad (fF) to 500 fF. In these simulations, there was no on-chip ground-shield and system parameters were as follows: $T_{sub}$=200 μm, Sub_res=10 Ω·cm, Sub_$\epsilon_r$=11.7, W=1 5 μm, L=180 μm, D=50 μm, Metal Sheet Resistance=2 mΩ/□. The graphs of FIG. 14 to FIG. 19 show efficiency plotted against frequency for different values of $R_L$ and $C_L$, where there is no on-chip ground-shield and system parameters are the following: $T_{sub}$=200 μm, Sub_res=10 Ω·cm, Sub_$\epsilon_r$=11.7, W=15 μm, L=180 μm, D=25 μm, Metal Sheet Resistance=2 mΩ/□. The graphs of FIG. 20 to FIG. 25 show the efficiency versus frequency for different values of $R_L$ and $C_L$ where there is no on-chip ground-shield and system parameters are the following: $T_{sub}$=200 μm, Sub_res=10 Ω·cm, Sub_$\epsilon_r$=11.7, W=15 μm, L=330 μm, D=50 μm, Metal Sheet Resistance=2 mΩ/□. FIG. 26 shows a graph of power efficiency versus frequency for selected exemplary values of $C_L$ and an $R_L$ of 300Ω for three different sets of D and L (D=50 μm, L=180 μm; D=25 μm, L=180 μm; and D=50 μm, L=330 μm). FIG. 27 shows a graph of power efficiency versus frequency for selected exemplary values of $C_L$ and an $R_L$ of 3000Ω for three different sets of D and L (D=50 μm, L=180 μm; D=25 μm, L=180 μm; and D=50 μm, L=330 μm).

Figure 28:
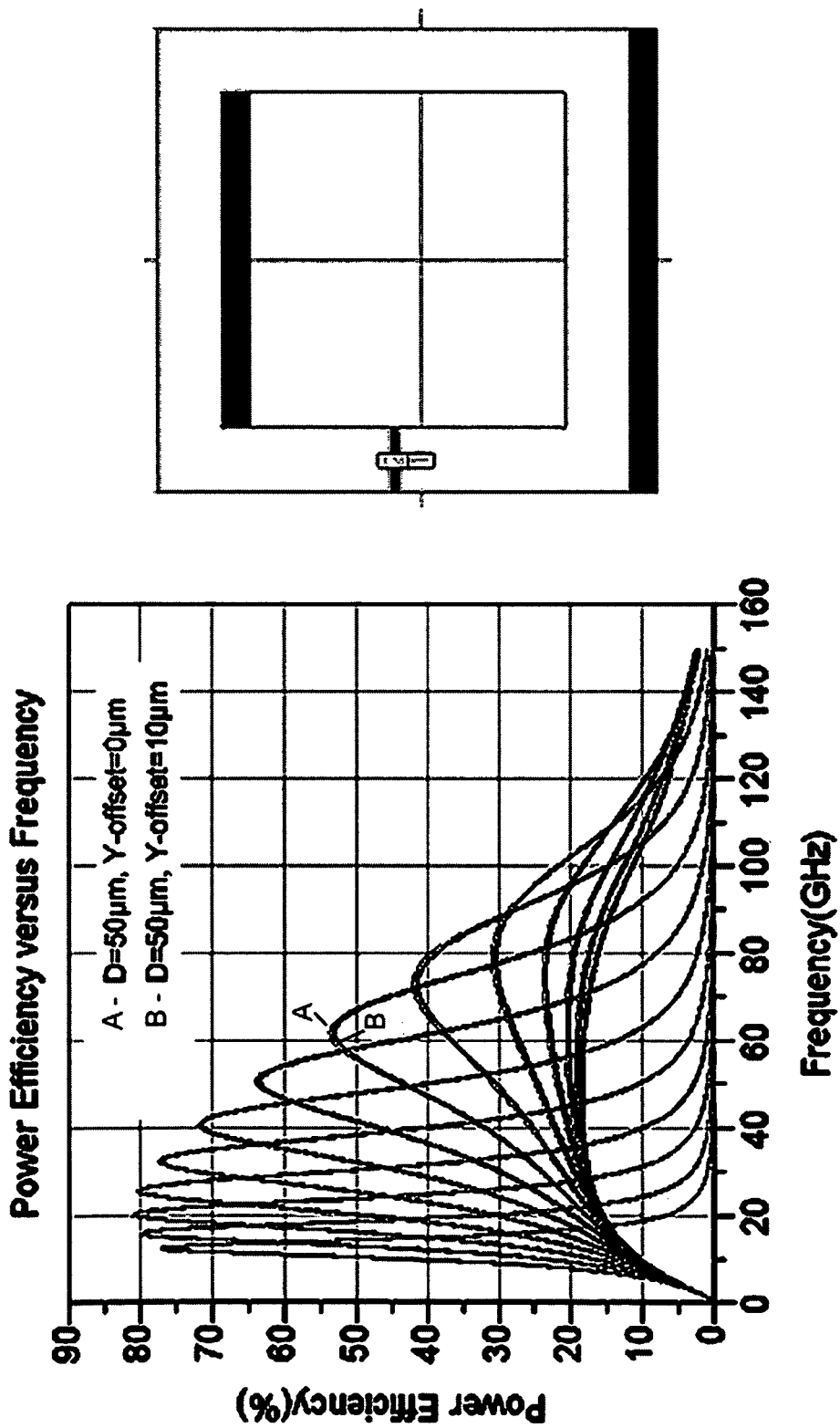
FIG. 28 shows a graph of power efficiency plotted against frequency for different values of $C_L$ as one loop of the highly coupled antenna structure moves with respect to the other along the Y axis where $R_L$=300Ω.
Figure 29:
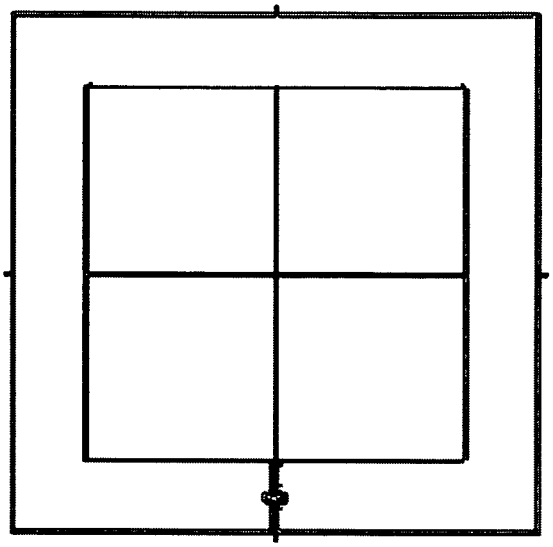
FIG. 29 shows a graph of power efficiency plotted against frequency for different values of $C_L$ as one loop of the highly coupled antenna structure moves with respect to the other for a change distance between the loops where $R_L$=300Ω.
Figure 29:
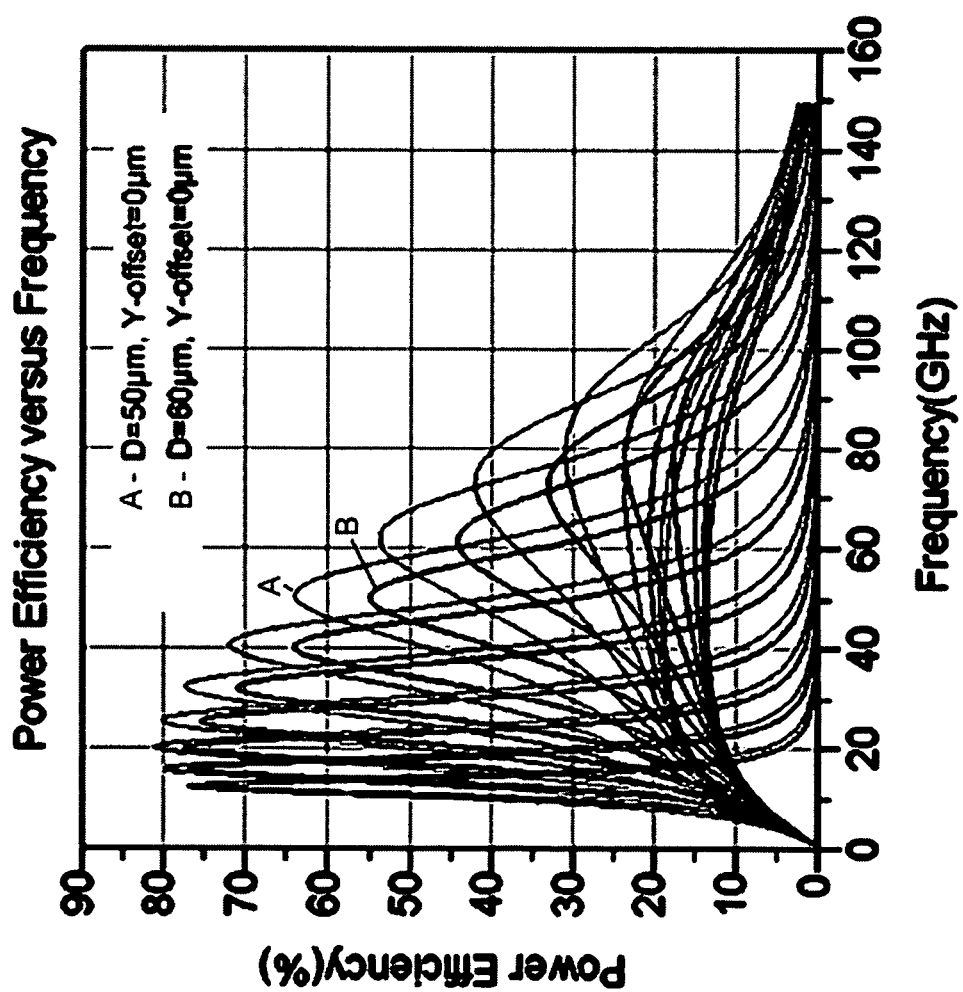
Figure 30:
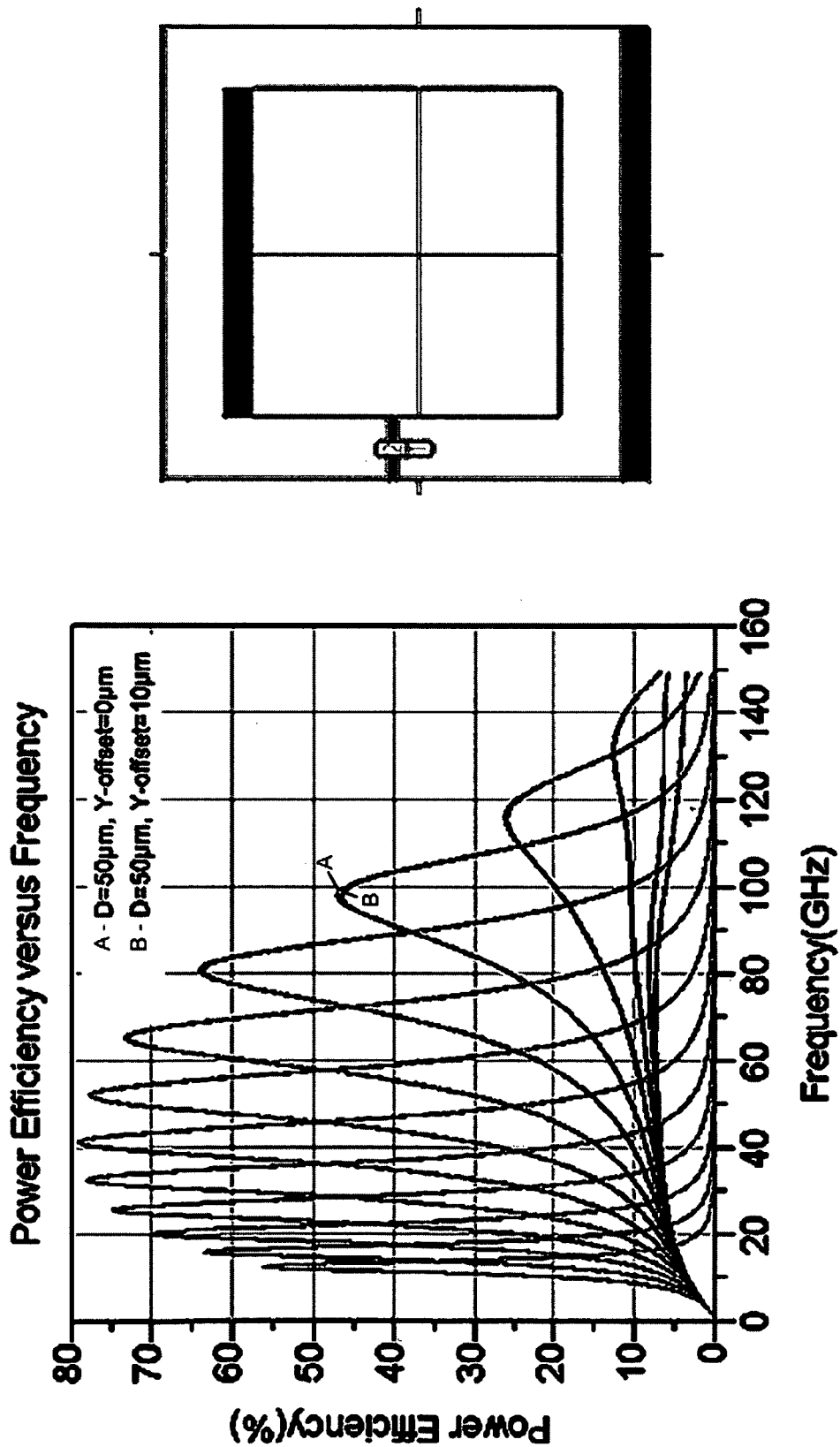
FIG. 30 shows the graph of power efficiency plotted against frequency for different values of $C_L$ for an offset along the Y axis where $R_L$=1000Ω.
Figure 31:
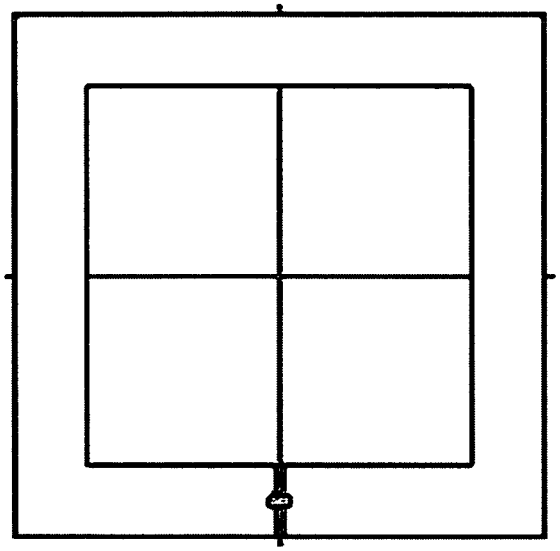
FIG. 31 shows the same graph power efficiency plotted against frequency for different values of $C_L$ for a change in D where $R_L$=1000Ω.
Figure 31:
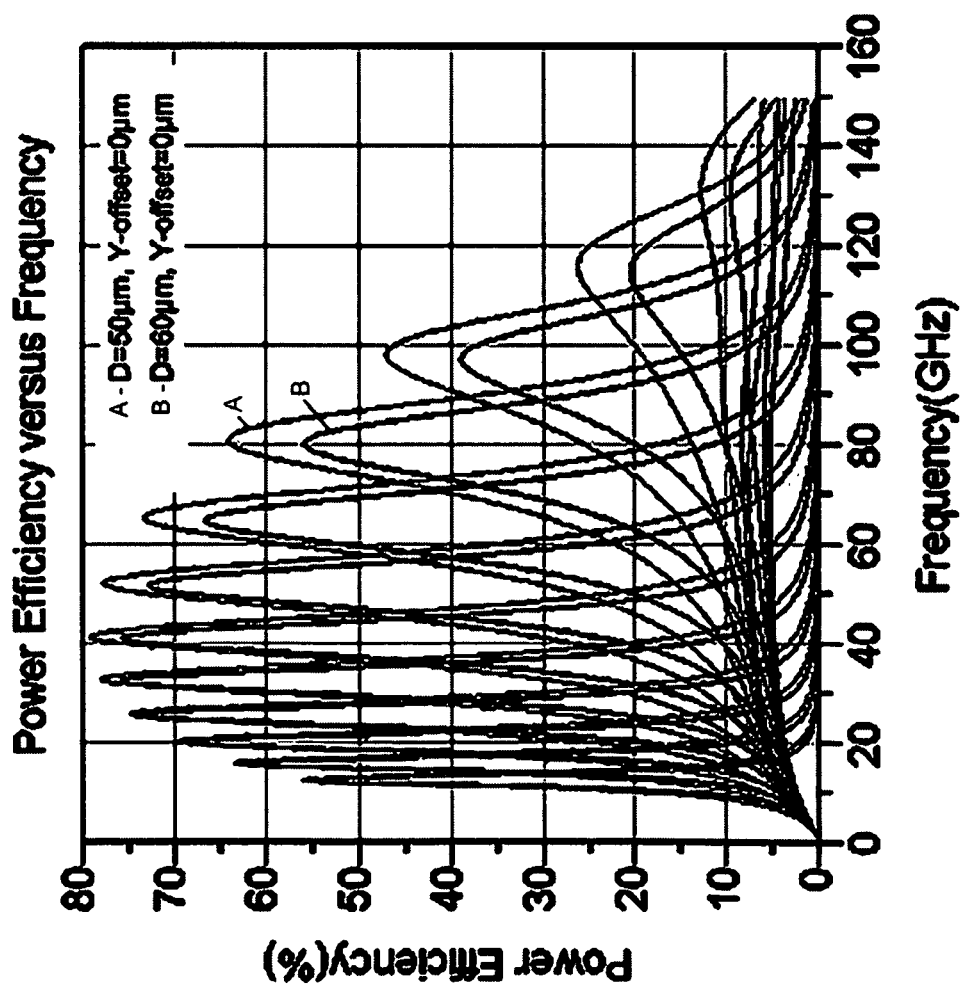

The graphs of FIG. 28 and FIG. 29 show efficiency plotted against frequency for different values of $C_L$ as one loop of the highly coupled antenna structure moves with respect to the other (such as can be caused by a variation in mounting position of a flip chip on a circuit board). FIG. 28 shows that the curves substantially overlap for a 10 μm offset along the Y axis. In FIG. 28, $R_L$=300Ω and 1 fF<$C_L$<500 fF, $T_{sub}$=200 μm, Sub_res=10 Ω·cm, Sub_$\epsilon_r$=1.7, W=15 μm, L=180 μm, D=50 μm, Metal Sheet Resistance=2 mΩ/□, offset in Y direction=10 μm. FIG. 29 shows that for a 10 μm change in D (from 50 μm to 60 μm) while some separation of the curves is more perceptible than in FIG. 28, the two resonant structures remain highly coupled. In FIG. 29, $R_L$=300Ω and 1 fF<CL<500 fF, $T_{sub}$=200 μm, Sub_res=10 Ω·cm, Sub_$\epsilon_r$=11.7, W=15 μm, L=180 μm, D=60 μm, Metal Sheet Resistance=2 mΩ/□, offset in Y direction=0 μm. FIG. 30 shows the graph of a 10 μm offset along the Y axis for $R_L$=1000Ω. As in FIG. 28 ($R_L$=300Ω), the curves substantially overlap. FIG. 31 shows the same graph as in FIG. 29 ($R_L$=300Ω) for a 10 μm change in D (from 50 μm to 60 μm) where $R_L$=1000Ω.

Figure 32:
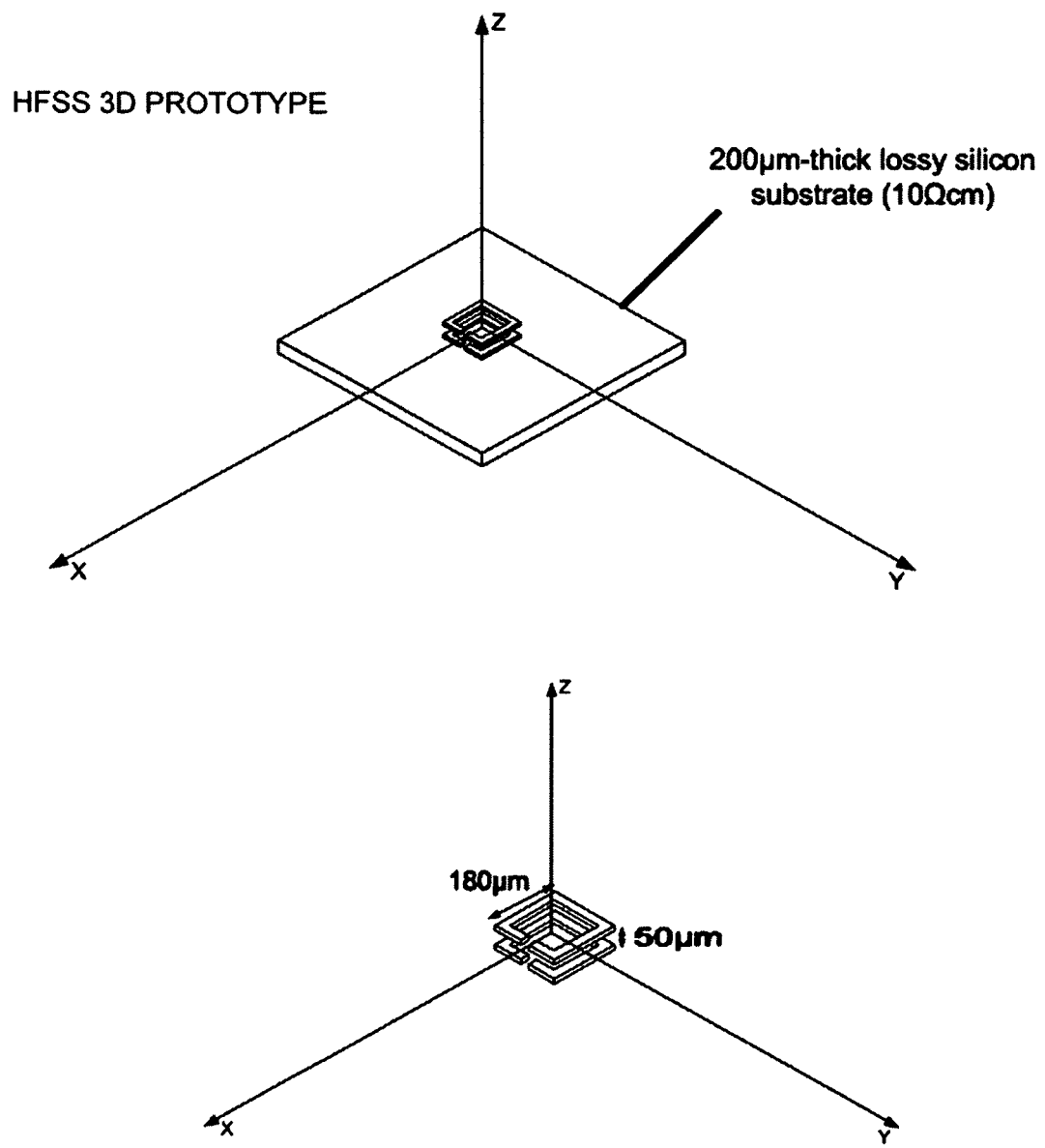
FIG. 32 shows an experimental setup for a simulation (top) and a zoomed view of the two highly coupled resonant loops (bottom).

FIG. 32 shows an illustration of an experimental setup for a simulation (top) and a zoomed view of the two highly coupled resonant loops (bottom). In the top illustration the smaller overlying rectangle represents a 200 μm thick lossy silicon substrate (10 Ωcm) and the lower larger rectangle represents the radiation boundary defined for calculation purposes. The lower drawing shows a zoomed view of the center dark representation in the top drawing of the two coils of a highly resonant coupled antenna structure. The two coils visible in the lower illustration of FIG. 32 are each 180 μm long on a side and spaced apart by 50 μm.

Figure 33:
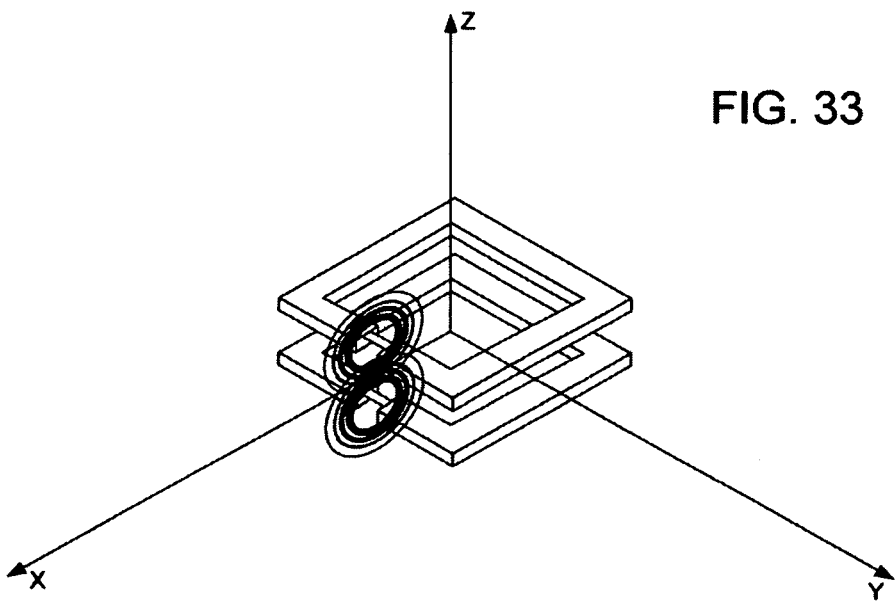
FIG. 33 shows an illustration of a simulation E-field result for two highly coupled resonant loops in the XZ plane.
Figure 34:
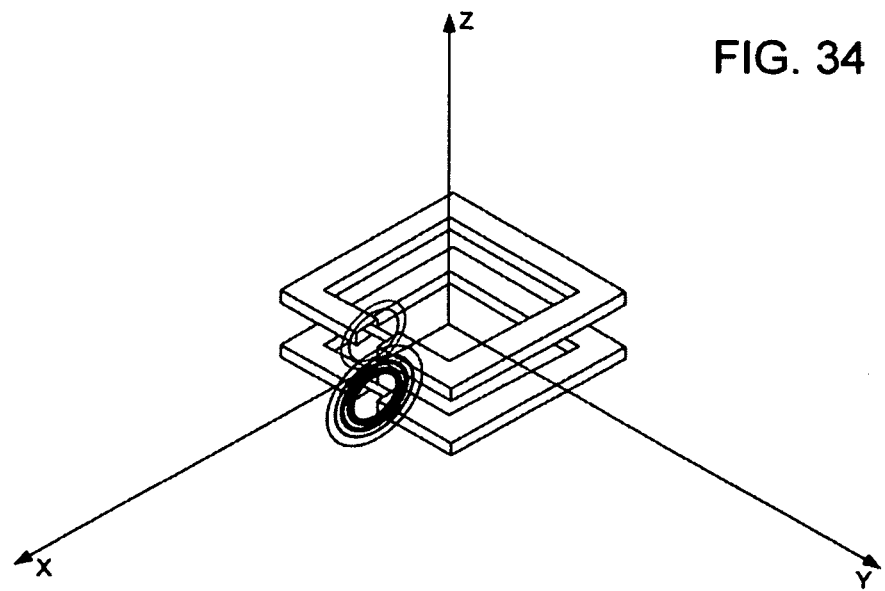
FIG. 34 shows an illustration of a simulation E-field result for two non-resonant loops in the XZ plane.
Figure 35:
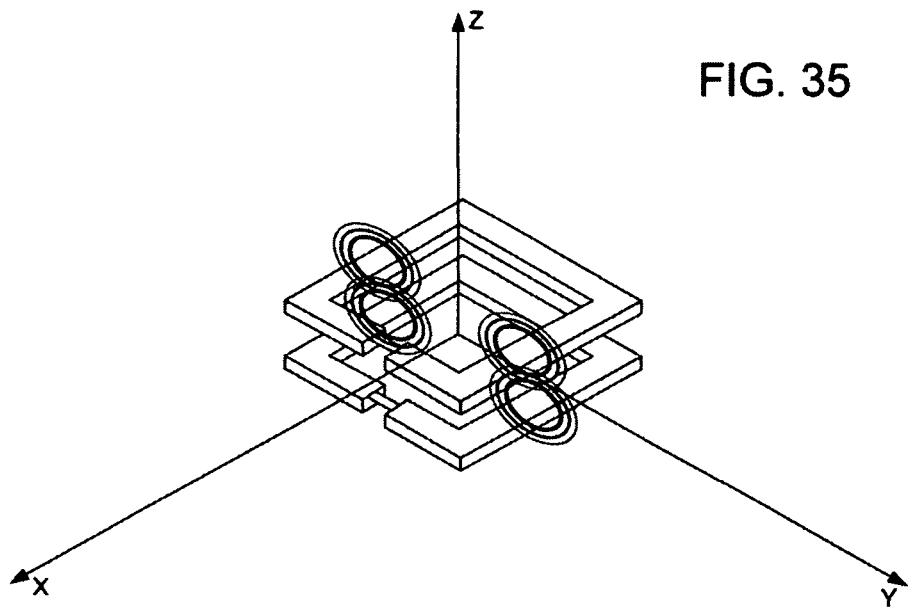
FIG. 35 shows an illustration of a simulation E-field result for two highly coupled resonant loops in the YZ plane.
Figure 36:
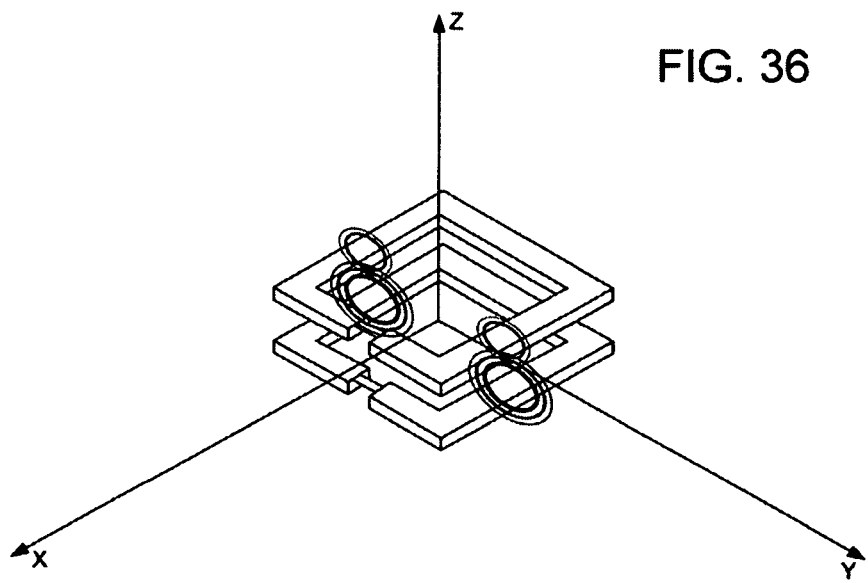
FIG. 36 shows an illustration of a simulation E-field result for two non-resonant loops in the YZ plane.

FIG. 33 to FIG. 35 are illustrations of field lines which show the affects of strong resonance near field coupling as compared to non-resonant or systems using inductive only coupling (with no traveling wave). In these simulations (FIG. 33 to FIG. 35), the lower loop is the driven loop. FIG. 33 shows an illustration of a simulation E-field result for two highly coupled resonant loops in the XZ plane. FIG. 34 shows an illustration of a simulation E-field result for two non-resonant loops in the XZ plane. FIG. 35 shows an illustration of a simulation E-field result for two highly coupled resonant loops in the YZ plane. FIG. 36 shows an illustration of a simulation E-field result for two non-resonant loops in the YZ plane. In the non-resonant scenarios (FIG. 34 and FIG. 36) note that substantially no power is transferred to the top loop, thus simple inductive coupling does not work to transfer significant power. By contrast, the top loop of a pair of resonant antennas of a highly coupled antenna structure (FIG. 33 and FIG. 35) receives most of the power sent from the bottom loop.

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

While the present invention has been particularly shown and described with reference to the preferred mode as illustrated in the drawing, it will be understood by one skilled in the art that various changes in detail may be affected therein without departing from the spirit and scope of the invention as defined by the claims.

We claim:

1. An antenna structure for coupling electromagnetic energy between a chip and an off-chip element, comprising:
    a first resonant structure disposed on or in said chip, said first resonant structure configured to have a first resonant frequency; and
    a second resonant structure disposed on or in said off-chip element, said second resonant structure configured to have a second resonant frequency substantially the same as said first resonant frequency, said first resonant structure and said second resonant structure being mutually disposed within a near field distance of each other to form a coupled antenna structure configured to couple electromagnetic energy between said chip and said off-chip element, said electromagnetic energy having a selected wavelength in a wavelength range from microwave to sub-millimeter wave; at least a selected one of said first resonant structure and said second resonant structure comprises a resonant loop and a resonant capacitance.

2. The antenna structure of claim 1, wherein said off-chip element is selected from the group consisting of a circuit board, a thin film structure, a redistribution layer (RDL), a micro electro mechanical system (MEMS) based structure, a nano electro mechanical system (NEMS) based structure, and a different chip.

3. The antenna structure of claim 1, further comprising a low loss dielectric disposed between said chip and said off-chip element.

4. The antenna structure of claim 3, wherein said low loss dielectric comprises air.

5. The antenna structure of claim 1, further comprising a vacuum disposed between said chip and said off-chip element.

6. The antenna structure of claim 1, wherein said chip comprises a flip chip attached to said off-chip element by a selected one of solder bumps and gold bumps.

7. The antenna structure of claim 6, wherein an efficiency of coupling is substantially independent of a tilt of said chip relative to said off-chip element caused by different heights of said bumps.

8. The antenna structure of claim 6, wherein an efficiency of coupling is substantially independent of a lateral translation attachment alignment of said flip chip.

9. The antenna structure of claim 1, wherein said antenna has dimensions calculated according to a method comprising the steps of:
providing a desired resonant frequency for said highly coupled antenna structure;
providing a type of resonant antenna structure for each of two antennas of said highly coupled antenna structure;
providing an equation that calculates the quantity $$\frac{Q_{load}}{Q_{total}}$$

for said highly coupled antenna structure;
selecting values of $R_L$ and physical dimensions of said highly coupled antenna structure; calculating said quantity $$\frac{Q_{load}}{Q_{total}};$$

and
iteratively repeating said steps of selecting and calculating to maximize said quantity $$\frac{Q_{load}}{Q_{total}}.$$

10. The antenna structure calculated according to the method of claim 9, wherein said step of providing an equation comprises providing the equation:

$$\frac{1}{Q_{total}} = \frac{1}{Q_{ohmic}} + \frac{1}{Q_{rad}} + \frac{1}{Q_{substrate\_loss}} + \frac{1}{Q_{load}}.$$

11. An antenna structure for coupling electromagnetic energy between a chip and an off-chip element, comprising:
a first resonant structure disposed on or in said chip, said first resonant structure configured to have a first resonant frequency; and
a second resonant structure disposed on or in said off-chip element, said second resonant structure configured to have a second resonant frequency substantially the same as said first resonant frequency, said first resonant structure and said second resonant structure being mutually disposed within a near field distance of each other to form a coupled antenna structure configured to couple electromagnetic energy between said chip and said off-chip element, said electromagnetic energy having a selected wavelength in a wavelength range from microwave to sub-millimeter wave;
wherein at least one of said first resonant structure and said second resonant structure comprises a selected one of a dipole antenna, a slot antenna, a yagi antenna, a patch antenna, a log-periodic antenna, and an antenna comprising a structure selected from the group consisting of a MEMS structure, a NEMS structure, a meta material and a periodic structure.

12. The antenna structure of claim 11, wherein said off-chip element is selected from the group consisting of a circuit board, a thin film structure, a redistribution layer (RDL), a micro electro mechanical system (MEMS) based structure, a nano electro mechanical system (NEMS) based structure, and a different chip.

13. The antenna structure of claim 11, further comprising a low loss dielectric disposed between said chip and said off-chip element.

14. The antenna structure of claim 13, wherein said low loss dielectric comprises air.

15. The antenna structure of claim 11, further comprising a vacuum disposed between said chip and said off-chip element.

16. The antenna structure of claim 11, wherein said chip comprises a flip chip attached to said off-chip element by a selected one of solder bumps and gold bumps.

17. The antenna structure of claim 16, wherein an efficiency of coupling is substantially independent of a tilt of said chip relative to said off-chip element caused by different heights of said bumps.

18. The antenna structure of claim 16, wherein an efficiency of coupling is substantially independent of a lateral translation attachment alignment of said flip chip.

19. The antenna structure of claim 11, wherein said antenna has dimensions calculated according to a method comprising the steps of:
providing a desired resonant frequency for said highly coupled antenna structure;
providing a type of resonant antenna structure for each of two antennas of said highly coupled antenna structure;
providing an equation that calculates the quantity $$\frac{Q_{load}}{Q_{total}}$$

for said highly coupled antenna structure;
selecting values of $R_L$ and physical dimensions of said highly coupled antenna structure;
calculating said quantity $$\frac{Q_{load}}{Q_{total}};$$

and
iteratively repeating said steps of selecting and calculating to maximize said quantity $$\frac{Q_{load}}{Q_{total}}.$$

20. The antenna structure calculated according to the method of claim 19, wherein said step of providing an equation comprises providing the equation:

$$\frac{1}{Q_{total}} = \frac{1}{Q_{ohmic}} + \frac{1}{Q_{rad}} + \frac{1}{Q_{substrate\_loss}} + \frac{1}{Q_{load}}.$$

\* \* \* \* \*